US006410958B1

United States Patent
Usui et al.

(10) Patent No.: US 6,410,958 B1
(45) Date of Patent: Jun. 25, 2002

(54) POWER MOSFET HAVING LATERALLY THREE-LAYERED STRUCTURE FORMED AMONG ELEMENT ISOLATION REGIONS

(75) Inventors: Yasunori Usui, Yokohama; Shigeo Kouzuki, Kawasaki, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/987,878

(22) Filed: Nov. 16, 2001

(30) Foreign Application Priority Data

Nov. 27, 2000 (JP) .......................... 2000-359762

(51) Int. Cl.⁷ .................. H01L 29/76; H01L 29/94; H01L 31/062; H01L 31/113; H01L 31/119
(52) U.S. Cl. .................. 257/329; 257/339; 257/401
(58) Field of Search .................. 438/212, 268; 257/328, 329, 327, 332, 339, 393, 395–398, 401, 653, 655

(56) References Cited

U.S. PATENT DOCUMENTS

| 4,754,310 A | 6/1988 | Coe | |
| 5,438,215 A | 8/1995 | Tihanyi | |
| 5,801,408 A | * 9/1998 | Takahashi | 257/212 |
| 5,895,939 A | * 4/1999 | Ueno | 257/264 |
| 6,040,600 A | 3/2000 | Uenishi et al. | |
| 6,081,009 A | 6/2000 | Neilson | |
| 6,184,555 B1 | * 2/2001 | Tihanyi et al. | 257/329 |
| 6,337,499 B1 | * 1/2002 | Werner | 257/329 |

FOREIGN PATENT DOCUMENTS

| JP | 10-223896 | 8/1988 |
| JP | 7-7154 | 1/1995 |
| JP | P2000-260982 A | 9/2000 |

OTHER PUBLICATIONS

L. Lorenz, et al. COOLMOS—a new milestone in high voltage Power MOS, The 11$^{th}$ International Symposium On Power Semiconductor Devices And ICs, ISPSD'99 Proceedings, IEEE Electron Devices Society, May 26–28, 1999, pp. 3–10.

* cited by examiner

Primary Examiner—Olik Chaudhuri
Assistant Examiner—Hoai Pham
(74) Attorney, Agent, or Firm—Oblon, Spivak, McClelland, Maier & Neustadt, P.C.

(57) ABSTRACT

A semiconductor apparatus has an NPN (or PNP) laterally three-layered pillar formed in a mesh form among a plurality of trench type element isolation regions, and having a source and gate on an upper surface of the three-layered pillar, and a drain on a lower surface thereof. A depth DT and minimum planar width WTmin of the element isolation region and a width WP of the three-layered pillar are configured to satisfy a relation of $3.75 \leq DT/WP \leq 60$ or $5.5 \leq DT/WTmin \leq 14.3$. The above configuration realizes a high breakdown voltage and low on-resistance are realized.

20 Claims, 11 Drawing Sheets

US 6,410,958 B1

POWER MOSFET HAVING LATERALLY THREE-LAYERED STRUCTURE FORMED AMONG ELEMENT ISOLATION REGIONS

CROSS-REFERENCE TO RELATED APPLICATIONS

This application is based upon and claims the benefit of priority from the prior Japanese Patent Application No. 2000-359762, filed Nov. 27, 2000, the entire contents of which are incorporated herein by reference.

BACKGROUND OF THE INVENTION

1. Field of the Invention

The present invention relates to a semiconductor apparatus, particularly to a semiconductor apparatus in which a MOSFET is formed on an Si pillar of a longitudinal and laterally three-layered structure of NPN (or PNP), and to a structure suitable for a power switching device which requires a low on-resistance/high breakdown voltage.

2. Description of the Related Art

A power switching device utilizing a MOSFET is required to have a low on-resistance/high breakdown voltage. In a power MOSFET having a conventional planar structure, however, when the on-resistance is lowered, the breakdown voltage is also lowered. When the breakdown voltage is raised, the on-resistance is raised. The device has an opposite relation.

That is, in the power MOSFET of the planar structure, a MOS structure is formed on the upper surface of an N$^-$ epitaxial layer formed, for example, on an N$^+$ substrate, and a current path extending to the MOSFET on the upper surface from a back surface of the substrate via the N$^-$ epitaxial layer is formed.

Therefore, a resistance during an on operation of the MOSFET (on-resistance) depends on a thickness of the N$^-$ epitaxial layer. Moreover, since a depletion layer extends in the N$^-$ epitaxial layer, the breakdown voltage is determined by the thickness of the N$^-$ epitaxial layer.

As described above, the current path is the same as a region for maintaining the breakdown voltage. Therefore, when the thickness of the N$^-$ epitaxial layer is set to be large for enhancement of the breakdown voltage, the on-resistance increases. Conversely, when the N$^-$ epitaxial layer is formed to be thin and the on-resistance is lowered, the breakdown voltage also decreases. Such opposite relation exists, and it is difficult to satisfy both conditions.

In order to wipe away the relation opposite to the relation of the low on-resistance/high breakdown voltage, and obtain the low on-resistance/high breakdown voltage in the power MOSFET of the conventional planar structure, for example, a MOSFET (cool MOS; trademark of Siemens Co., Germany) having a super junction structure is known, for example, by "Cool MOS-a new milestone in high voltage Power MOS" by L. Lorenz, G. Deboy (Document 1) (e.g., Jpn. Pat. Appln. KOKAI Publication No. 7-7154).

In the power MOSFET of the super junction structure, as shown in FIG. 1, an N$^+$ pillar layer 71 constituting the current path and a P$^+$ pillar layer 72 for maintaining the reverse breakdown voltage between drain and source are formed in a depth direction (vertical direction), respectively.

According to the structure, the on-resistance depends on an impurity concentration of the N$^+$ pillar layer 71. Moreover, the breakdown voltage extends the depletion layer in a lateral direction, and is therefore determined by an impurity concentration and width of the P$^+$ pillar layer 72.

As a result, it is possible to secure an equal reverse breakdown voltage (e.g., 600V) between drain and source and to reduce the on-resistance to about ⅓ to ¼ with respect to the power MOSFET of the conventional planar structure.

Additionally, a manufacturing process of the MOSFET disclosed in Document 1 is complicated, because epitaxial growth of silicon, patterning, and ion implantation need to be repeated a plurality of times (six times in FIG. 1). With such very long process, cost and time are required. It is feared that a manufacturing cost largely rises.

A method of ion-implanting N or P type impurities into each side surface of a striped trench formed in a semiconductor substrate and forming a longitudinal N or P pillar layer has also been proposed (U.S. Pat. No. 6,040,600). However, also in this method, two ion implantation steps are necessary for forming the N and P pillar layers for one element of MOSFET, and further there is a restriction that only a MOSFET having a stripe pattern as a planar form can be formed.

Therefore, there has been a demand for establishment of a new structure of the power MOSFET which is easy in manufacturing, high in breakdown voltage, and low in on-resistance.

BRIEF SUMMARY OF THE INVENTION

According to a first aspect of the present invention, there is provided a semiconductor apparatus comprising:

a semiconductor substrate of a first conductivity type having a first and a second main surface;

a plurality of element isolation regions formed to have a predetermined depth DT from the first main surface of the semiconductor substrate, and formed by filling a plurality of trenches with an insulator;

a laterally three-layered pillar formed among the plurality of element isolation regions with a width WP and in a meshed planar shape, comprising a first and a second pillar layer of the first conductivity type which contact two adjacent element isolation regions out of the plurality of element isolation regions over a depth direction, respectively, and a third pillar layer of a second conductivity type formed between the first and the second pillar layer, and having a relation of 3.75≦DT/WP≦60 between the width WP of the three-layered pillar and the depth DT of the element isolation region;

a base region of the second conductivity type formed on an upper surface of the third pillar layer of the second conductivity type;

a source region of the first conductivity type selectively formed on the upper surface of the base region;

a gate electrode formed on the base region between the source region and an upper surface of the first or the second pillar layer in an insulating manner; and a drain layer of the first conductivity type formed on the second main surface of the semiconductor substrate, and contacting a lower surface of the three-layered pillar.

According to a second aspect of the present invention, there is provided a semiconductor apparatus comprising:

a semiconductor substrate of a first conductivity type having a first and a second main surface;

a plurality of element isolation regions formed to have a predetermined depth DT from the first main surface of the semiconductor substrate, and formed by filling a plurality of trenches with an insulator;

a laterally three-layered pillar formed among the plurality of element isolation regions with a width WP and in a meshed planar shape, so as to have a plurality of openings having a minimum opening width WTmin, comprising a first and a second pillar layer of the first conductivity type which contact two adjacent element isolation regions out of the plurality of element isolation regions over a depth direction, respectively, comprising a third pillar layer of a second conductivity type formed between the first and the second pillar layer, and having a relation of $5.5 \leq DT/WTmin \leq 14.3$ between the opening width WTmin of the three-layered pillar and the depth DT of the element isolation region;

a base region of the second conductivity type formed on an upper surface of the third pillar layer of the second conductivity type;

a source region of the first conductivity type selectively formed on an upper surface of the base region;

a gate electrode formed on the base region between the source region and an upper surface of the first or the second pillar layer in an insulating manner; and a drain layer of the first conductivity type formed on the second main surface of the semiconductor substrate, and contacting a lower surface of the three-layered pillar.

According to a third aspect of the present invention, there is provided a semiconductor apparatus comprising:

a semiconductor substrate of a first conductivity type having a first and a second main surface;

a plurality of element isolation regions formed to have a predetermined depth DT from the first main surface of the semiconductor substrate, and formed by filling a plurality of trenches with an insulator;

a laterally three-layered pillar formed among the plurality of element isolation regions with a width WP and in a meshed planar shape so as to have a plurality of openings having a minimum opening width WTmin, comprising a first and a second pillar layer of the first conductivity type which contact two adjacent element isolation regions out of the plurality of element isolation regions over a depth direction, respectively, and comprising a third pillar layer of a second conductivity type formed between the first and the second pillar layer;

a base region of the second conductivity type formed on an upper surface of the third pillar layer of the second conductivity type;

a source region of the first conductivity type selectively formed on an upper surface of the base region;

a gate electrode formed on the base region between the source region and an upper surface of the first or the second pillar layer in an insulating manner; and a drain layer of the first conductivity type formed on the second main surface of the semiconductor substrate, and contacting a lower surface of the three-layered pillar, wherein the plurality of element isolation regions include an edge termination isolation region surrounding a region with the three-layered pillar formed therein, and a relation with the minimum opening width WTmin of the meshed three-layered pillar satisfies WTEmin≧WTmin, assuming that a minimum opening width of one of the plurality of trenches corresponding to the edge termination isolation region is WTEmin.

DETAILED DESCRIPTION OF THE INVENTION

Prior to description of embodiments of the present invention, a structure and manufacturing method of a deep trench MOSFET (hereinafter abbreviated as DTMOS) already proposed by the present inventors will be described.

Figure 2:
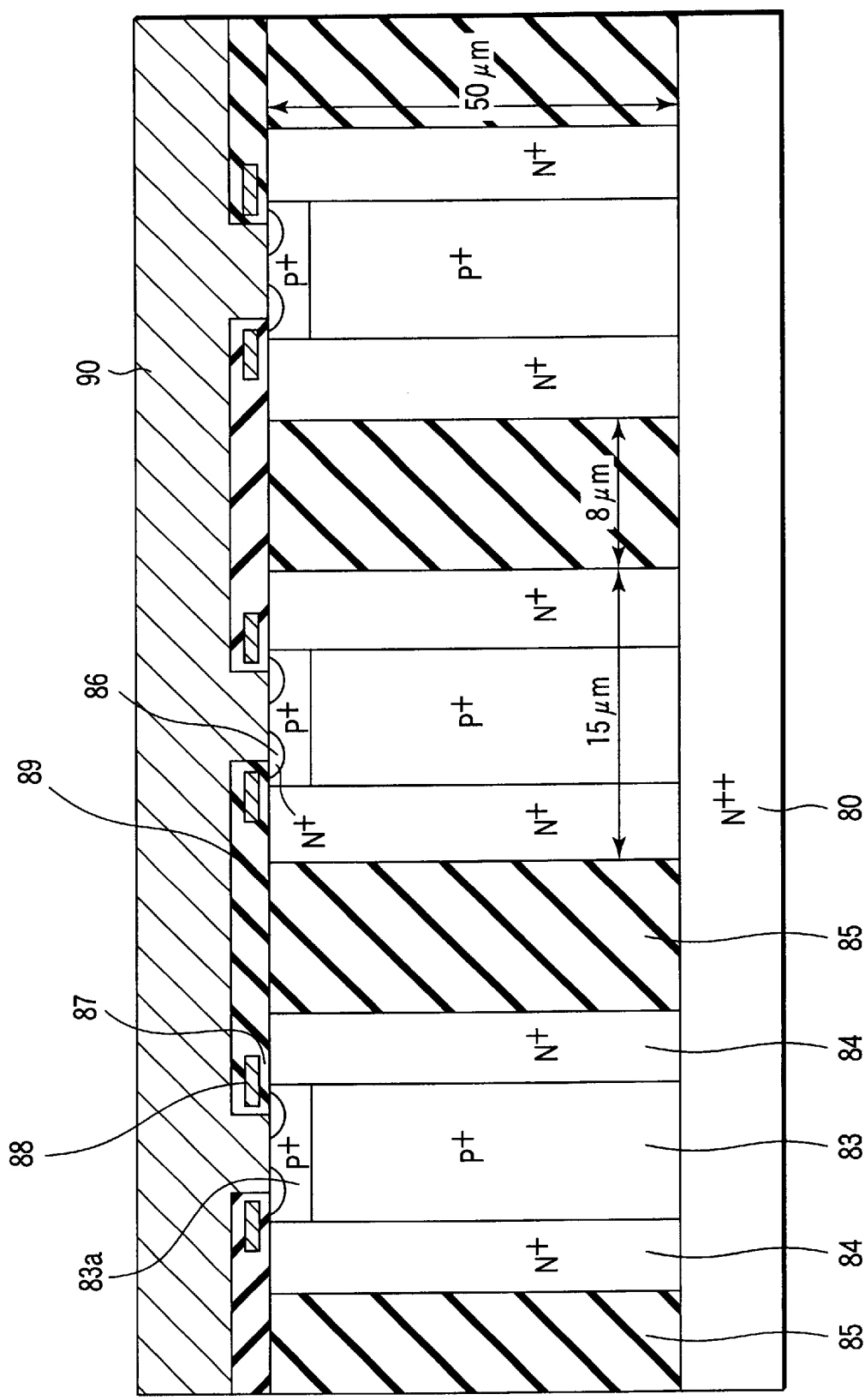
FIG. 2 is a sectional view showing a part of a deep trench MOSFET (DTMOS) as a basic structure of the present invention.

FIG. 2 is a sectional view showing a part of a basic structure of the DTMOS proposed by the present inventors. In the DTMOS, an N⁻ epitaxial layer (not shown) is formed on an upper surface of an N⁺⁺ substrate 80, a plurality of trenches for element isolation are formed to have a predetermined depth from the surface of the layer, and an insulator is buried in the trenches so that an element isolation region 85 is formed.

An NPN pillar having a vertical section of a three-layered sandwich structure is formed between the trenches for element isolation. The NPN pillar is formed of an N⁺ pillar layer 84 having a rectangular section formed in a vertical direction along a side wall surface of the trench by ion-implanting and thermally diffusing an N-type impurity (e.g., arsenic; AS) and P-type impurity (e.g., boron; B) into a semiconductor substrate via a side wall of the trench for element isolation, and a P⁺ pillar layer 83 having a rectangular section formed in the vertical direction between the N⁺ pillar layers.

Additionally, a sum of (As—B) total amounts in the two N⁺ pillar layers 84 is set to be equal to a (B—As) total amount in the P⁺ pillar layer 83 with a difference of ±5% or less. An impurity amount can be controlled at a high precision by ion implantation of As and B into the trench side wall.

A P⁺ base region 83a is formed in an upper portion of the P⁺ pillar layer 83, an N⁺ source region 86 is selectively formed on the surface of the upper portion, and a gate electrode 88 is formed above a P region surface portion (channel region) sandwiched between the N⁺ source region 86 and the N⁺ pillar layer 84 via a gate oxide film 87. Furthermore, an interlayer dielectric film 89 is formed on the substrate including the gate electrode 88, and a source metal wiring 90 is formed to contact the N⁺ source region 86 via an opening of the interlayer dielectric film 89.

According to this structure, a power MOSFET structure is realized in which the N⁺ substrate 80 is a drain and the N⁺ pillar layer 84 is a current path between source and drain. Additionally, since two N⁺ pillar layers 84 (current path between source and drain) exist in one NPN pillar, a channel density is high, and an on-resistance (Ron) can be reduced. Moreover, the P⁺ pillar layer 83 can enhance a reverse breakdown voltage between drain and source.

Next, a manufacturing process of the DTMOS shown in FIG. 2 will roughly be described. First, the trench extending to the N⁺⁺ substrate 80 from the surface of the N⁻ epitaxial layer (not shown) formed on the N⁺⁺ substrate 80 is formed in a portion to be the isolation region 85 later by reactive ion etching (RIE). In this case, a portion other than the trench on the surface of the N⁻ epitaxial layer is covered with the oxide film.

Subsequently, ions of As and B are implanted into the trench side wall at an implantation angle of about 7°, for example, by a rotation ion implantation process. Subsequently, As and B are simultaneously diffused by thermal diffusion at 1150° C. for 24 or more hours.

In this case, a diffusion coefficient of B is sufficiently larger than a diffusion coefficient of As. Therefore, As diffuses about 2.5 μm from the trench side wall to form the N⁺ pillar layer 84, and B diffuses about 7.5 μm and overlaps with diffusion from opposite sides to form the P⁺ pillar layer 83. That is, for the structure after thermal treatment, the NPN pillar is completed in which the inner P⁺ pillar layer 83 is sandwiched between the N⁺ pillar layers 84 in a trench side wall portion.

Subsequently, the oxide film ($SiO_2$ film) is formed on the trench side surface by thermal oxidation, and further an $SiO_2$ film or an SiN film is formed by a chemical vapor deposition process (CVD).

Subsequently, the substrate surface is flatted by chemical mechanical polishing (CMP). The subsequent process is performed similarly as a manufacturing process of MOSFET of a planar structure. That is, the P⁺ base region 83*a* is formed in the upper portion of the P⁺ pillar layer 83, and the gate electrode 88 is formed on a part of the P⁺ base region 83*a* via the N⁺ source region 86 and on the channel region via the gate oxide film 87. Thereby, the power MOSFET structure is realized in which the N⁺⁺ substrate 80 is the drain and the N⁺ pillar layer 84 is the current path.

That is, in a manufacturing method, as described above, the process including N⁻ epitaxial growth, information of the deep trench, formation of the NPN pillar by simultaneous implantation of B and As ions and thermal diffusion, and formation of the element isolation region by filling the trench is relatively short. Therefore, the process can largely be reduced as compared with the manufacturing method of the power MOSFET of a super junction structure, and a manufacturing cost considerably decreases.

Figure 3:
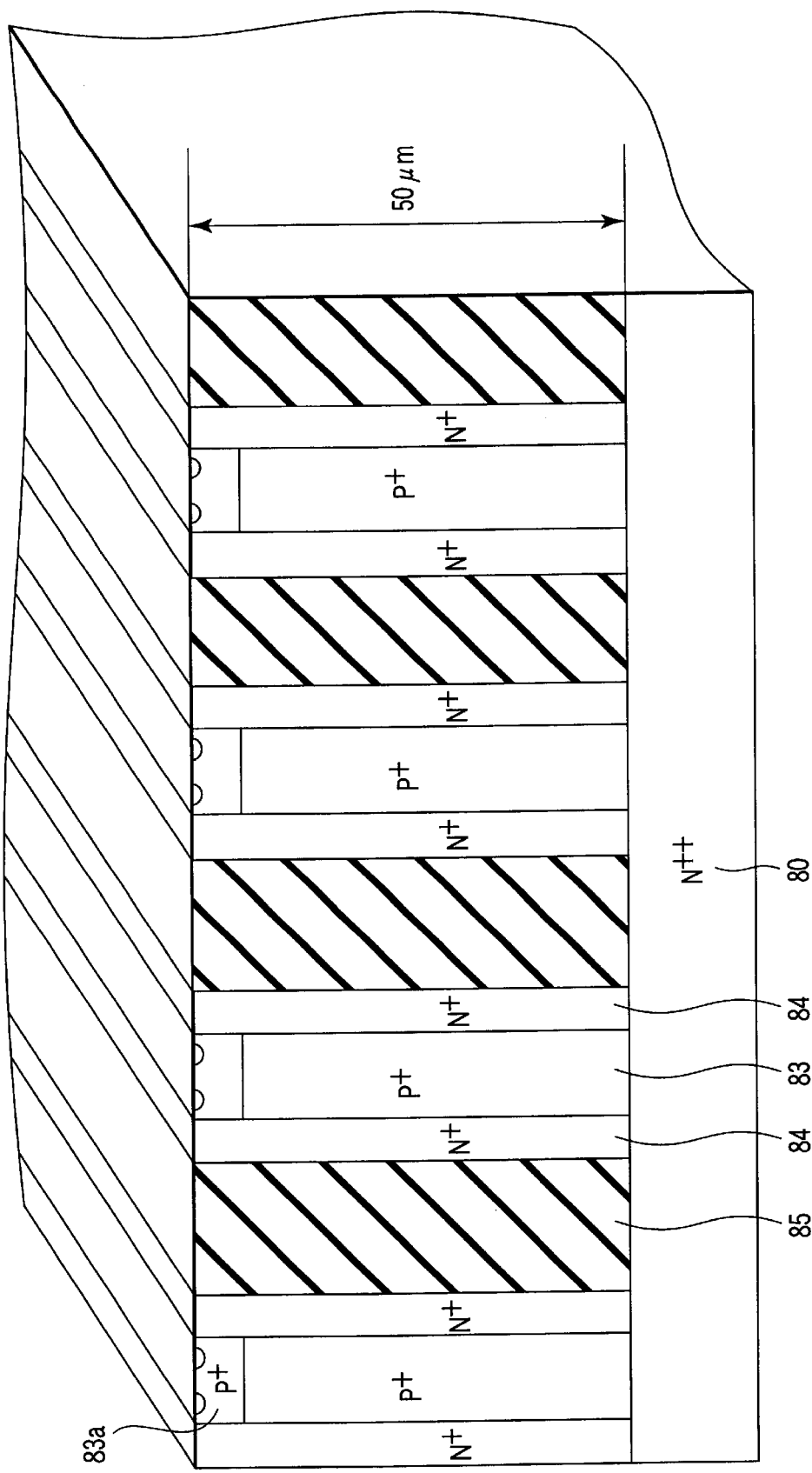
FIG. 3 is a perspective view showing a part of a planar pattern of a stripe pattern type and sectional structure as one example of the DTMOS of FIG. 2.

FIG. 3 is a perspective view showing a part of a planar pattern of a stripe pattern type DTMOS and sectional structure as one example of the DTMOS shown in FIG. 2. This structure is an arrangement of the NPN pillar of each unit element and trench portion in a stripe pattern form.

Figure 4:
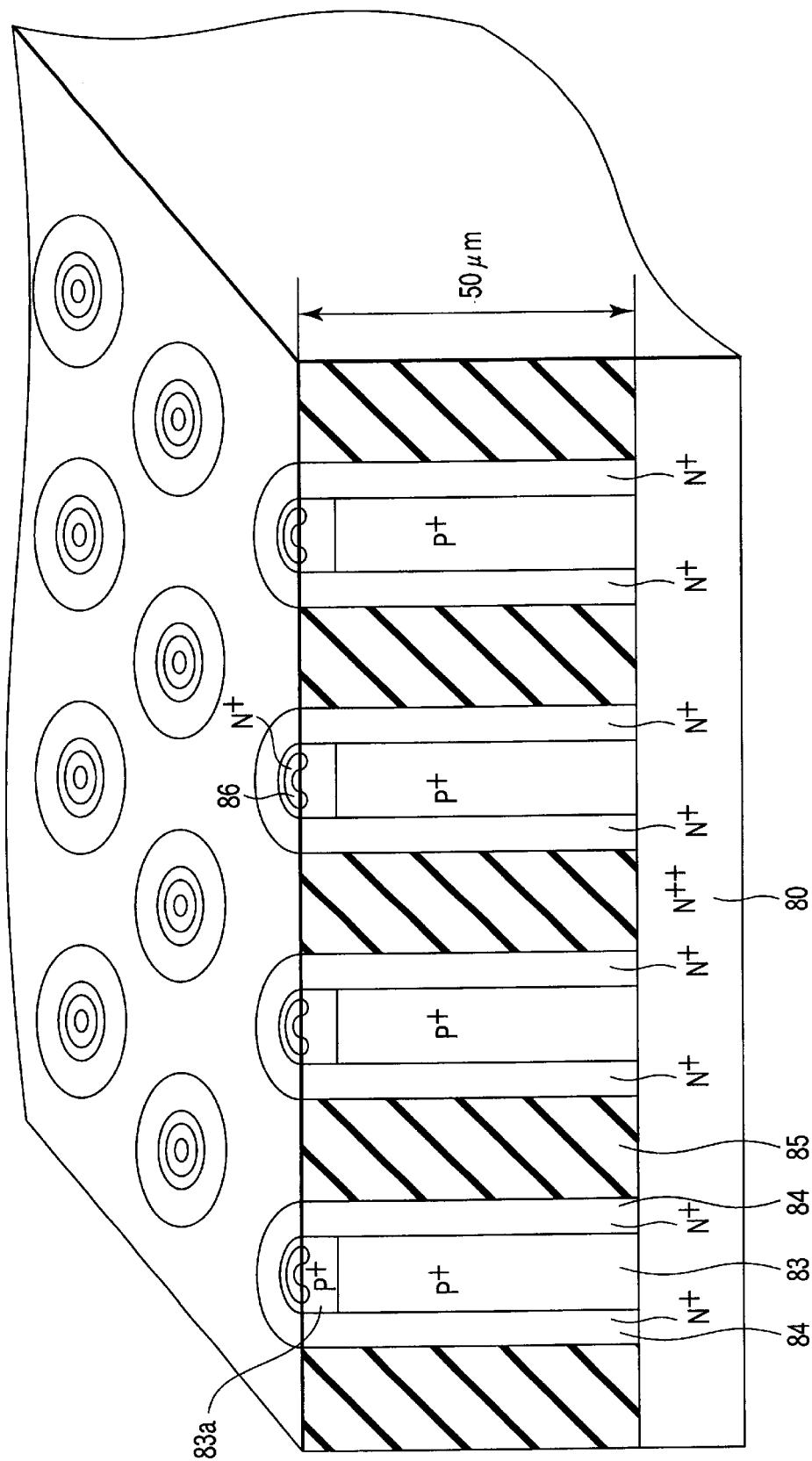
FIG. 4 is a perspective view showing apart of a planar pattern of a mesh pattern type and sectional structure as another example of the DTMOS of FIG. 2.

FIG. 4 is a perspective view showing a part of a planar pattern of a dot offset mesh type DTMOS and sectional structure as another example of the DTMOS shown in FIG. 2. Additionally, in both FIGS. 2 and 3, the dielectric film 89 and gate electrode 88 are not shown.

In this structure, planar circular NPN pillars are arranged in a dot offset mesh form in order to raise the channel density of the DTMOS.

Figure 5:
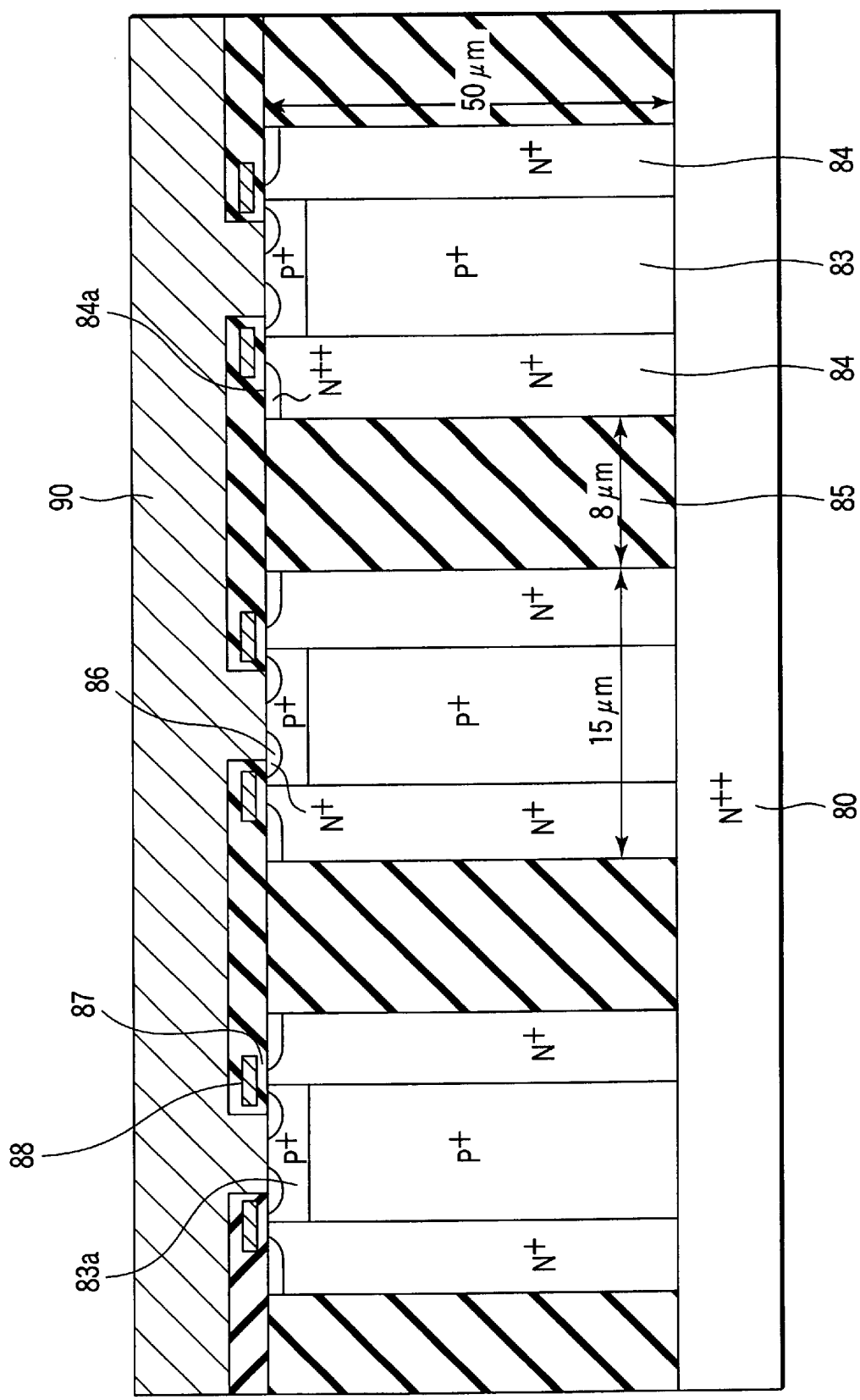
FIG. 5 is a sectional view of the DTMOS showing an example in which an Si pillar portion is improved in the basic structure of FIG. 2.

FIG. 5 is a sectional view showing one example of the structure of the DTMOS according to an improvement example of the NPN pillar of the DTMOS shown in FIGS. 2 to 4.

In the structure of FIG. 5, the surface of the N⁺ pillar layer 84 of the DTMOS shown in FIGS. 2 to 4 is modified such that an N⁺⁺ region 84*a* is formed in a portion continued to the side wall portion of the trench (element isolation region 85). Thereby, a depletion layer is prevented from reaching the surface of the N⁺ pillar layer 84 during applying of a voltage, and electric field concentration and breakdown do not easily occur. In this case, the N⁺⁺ region 84*a* can simultaneously be formed during formation of the N⁺ source region 86, and this does not involve an increase of the process.

Additionally, in the structure shown in FIGS. 2 to 4, the insulator 85 is buried in the trench. However, a long time is necessary for completely burying the insulator 85 such as the oxide film ($SiO_2$ film) inside the trench. Moreover, in a thermal process after burying, a large thermal stress is applied to silicon in a trench bottom portion because of a difference of a thermal expansion coefficient between silicon of the N⁺ pillar layer 84 and P⁺ pillar layer 83 and the insulator 85 such as the $SiO_2$ film. Therefore, a crystal defect occurs in the portion in a concentrated manner, and a leak current possibly increases. An example in which this respect is improved will be described hereinafter.

Figure 6:
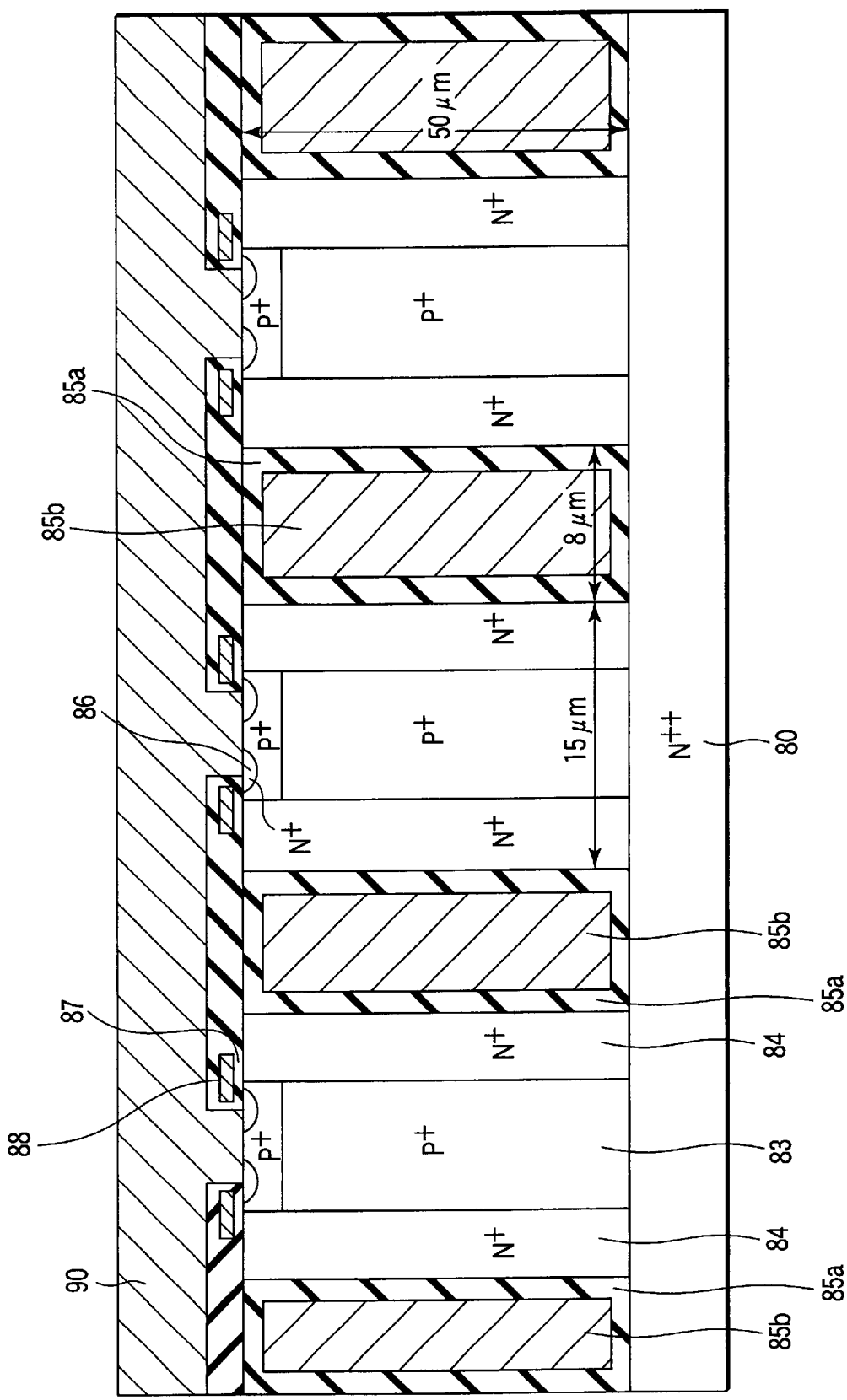
FIG. 6 is a sectional view of the DTMOS showing an example in which an element isolation region is improved in the basic structure of FIG. 2.

FIG. 6 is a sectional view showing one example of the structure of the DTMOS according to an improvement example of the element isolation region 85 shown in FIGS. 2 to 4.

In the structure shown in FIG. 6, the region is modified such that a dielectric film 85*a* is formed in the trench side surface of the DTMOSFET shown in FIGS. 2 to 4, and subsequently poly silicon 85*b* is buried in the trench. The poly silicon 85*b* inside the trench is not the current path, and does not have to be completely buried. Therefore, it is possible to form (bury) poly silicon at a high growth speed (for a short time).

Moreover, the thermal expansion coefficient of silicon of the N⁺ pillar layer 84 and P⁺ pillar layer 83 is equal to that of poly silicon 85*b* inside the trench. Therefore, the large thermal stress is not applied to silicon of the trench bottom portion even by the thermal process after burying of poly silicon 85*b*. Therefore, the crystal defect is prevented from occurring in the portion and the leak current is prevented from increasing.

Additionally, in order to realize the structure of the insulator as shown in FIG. 5, poly silicon may be buried inside the trench after forming the dielectric film such as the oxide film ($SiO_2$ film) on the trench side surface. In this case, poly silicon inside the trench is deposited from the opposite sides of the trench side surface, and can therefore be buried for a short time.

Moreover, according to the structure of the DTMOS shown in FIGS. 2 to 4, a low on-resistance/high breakdown voltage is satisfied as described above. Furthermore, when the planar pattern shape of the element isolation region and three-layered pillar, and the like are optimized, an on-resistance property and breakdown voltage are preferably improved.

Furthermore, a structure partially similar to the structure of the DTMOS according to the aforementioned proposal is disclosed in U.S. Pat. No. 4,754,310, 6,081,009, and Jpn. Pat. Appln. KOKAI Publication No. 1998-223896, but these do not relate to the three-layered pillar structure, and optimization of the planar pattern shape of the element isolation region and three-layered pillar is not described.

The present invention has been developed so as to solve the aforementioned problem, and an embodiment in which the DTMOS high in breakdown voltage and low in on-resistance can be realized will be described hereinafter.

<First Embodiment>

Figure 7:
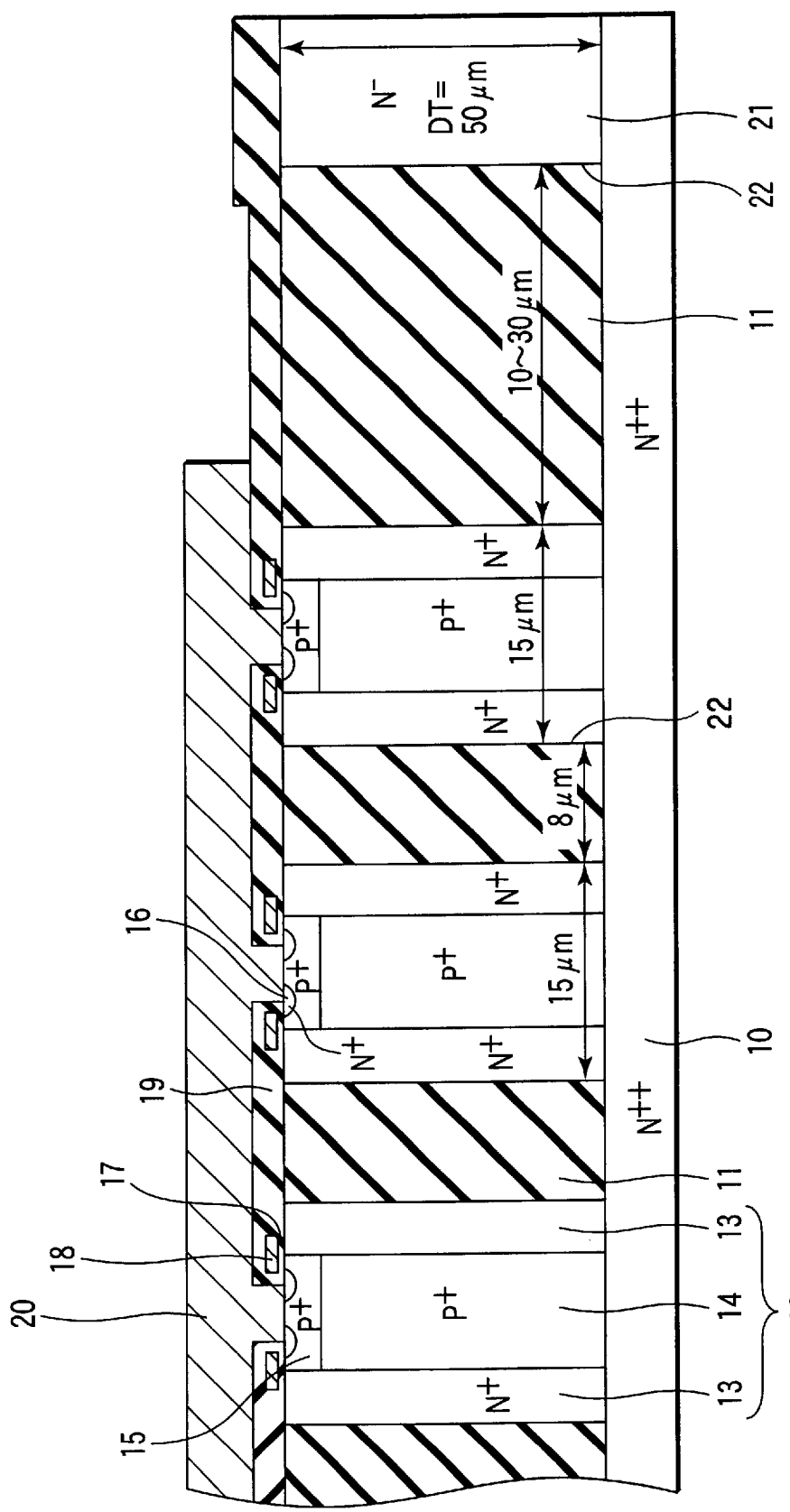
FIG. 7 is a sectional view showing a structure of a part of an element forming portion of the DTMOS having a cross intersecting mesh pattern and a part of a chip termination portion according to a first embodiment of the present invention.

FIG. 7 is a sectional view showing a structure of a part of an element forming portion of a chip of the DTMOS having a cross mesh pattern and a part of a chip edge termination portion according to a first embodiment of the present invention.

In the DTMOS, an $N^-$ epitaxial layer 21 is formed on an upper surface of an $N^{++}$ Si substrate 10. A plurality of trenches for element isolation 22 are formed to have a predetermined depth extending into the $N^{++}$ Si substrate 10 from the surface of the $N^-$ epitaxial layer 21, and the insulator is buried in the trench so that an element isolation region 11 is formed.

An NPN pillar 12 having a vertical section of the three-layered sandwich structure is formed between the trenches for element isolation 22. The NPN pillar 12 is constituted of an $N^+$ pillar layer 13 having a rectangular section formed in a vertical direction along a side wall surface of the trench by ion-implanting and thermally diffusing the N-type impurity (e.g., arsenic; AS) and P-type impurity (e.g., boron; B) into the $N^-$ epitaxial layer 21 via the side wall of the trench for element isolation 22, and a $P^+$ pillar layer 14 having a rectangular section formed in the vertical direction between the $N^+$ pillar layers.

Additionally, the sum of (As—B) total amounts in the two $N^+$ pillar layers 13 is set to be equal to the (B—As) total amount in the $P^+$ pillar layer 14 with the difference of ±5% or less. That is, the $N^+$ pillar layer 13 and $P^+$ pillar layer 14 have substantially the same concentration. The impurity amount can be controlled at the high precision by the ion implantation of As, B into the trench side wall.

A $P^+$ base region 15 having a high impurity concentration is formed in an upper portion of the $P^+$ pillar layer 14 in order to secure a desired threshold voltage Vth of the DTMOS, and an $N^+$ source region 16 is selectively formed on the surface of the upper portion. A gate electrode 18 is formed above a $P^+$ base region surface portion (channel region) sandwiched between the $N^+$ source region 16 and the $N^+$ pillar layer 13 via a gate oxide film 17.

Furthermore, an interlayer dielectric film 19 is formed on the substrate including the gate electrode 18, and a source metal wiring 20 is formed to contact the $N^+$ source region 16 via an opening of the interlayer dielectric film 19.

Moreover, as described later and shown in FIG. 8, the insulator is buried in the trench 22 of an edge termination portion formed to have a predetermined depth extending into the $N^{++}$ Si substrate 10 from the surface of the $N^-$ epitaxial layer so as to surround a region in which the NPN pillar 12 is formed, and an edge termination isolation region 11 is formed.

According to this structure, an N-type DTMOS (NMOSFET) is formed in which the $N^{++}$ Si substrate 10 is the drain and the $N^+$ pillar layer 13 is the current path between source and drain. Additionally, an NMOSFET structure having a high channel density is realized in which two $N^+$ pillar layers 13 (current path between source and drain) exist in one NPN pillar 12.

Additionally, a thermal oxide film ($SiO_2$) is used in the gate dielectric film 17 in order to keep a strength of the substrate, and poly silicon or metal silicide is used in the gate electrode 18.

One example of a manufacturing process of the DTMOS shown in FIG. 7 will next be described. First, after the $N^-$ epitaxial layer 21 having a low resistance is formed on the $N^{++}$ Si substrate 10, an etching mask (not shown) is formed on the surface of the $N^-$ epitaxial layer. Then, the deep trench 22 is formed to extend into the $N^{++}$ Si substrate 10 from the surface of the $N^-$ epitaxial layer 21.

Subsequently, the N-type impurity (As in the present example) and P-type impurity (B in the present example) are ion-implanted into the side wall of the trench 22 at the implantation angle of about 7°, for example, by the rotation ion implantation process. In this case, the ion implantation of As is performed on conditions such as an acceleration voltage of 60 KeV and a dosage of $4.1 \times 10^{13}$ $cm^{-2}$, and the ion implantation of B is performed on conditions such as an acceleration voltage of 60 KeV and a dosage of $4 \times 10^{13}$ $cm^{-2}$.

Subsequently, As and B are simultaneously diffused by thermal diffusion at 1150° C. for 2000 or more minutes. In this case, the diffusion coefficient of B is sufficiently larger than the diffusion coefficient of As. Therefore, the $N^+$ pillar layer 13 having the rectangular section along the vertical direction, and the $P^+$ pillar layer 14 having the rectangular section adjacent to the $N^+$ pillar layer in a lateral direction and overlapping with diffusions from the opposite sides are formed in the trench side wall surface substantially at the same concentration. That is, for the structure after thermal treatment, the NPN pillar 12 is formed in which the inner $P^+$ pillar layer 14 is sandwiched between the $N^+$ pillar layers 13 on the opposite sides (trench side wall portion).

Moreover, the sum of (As—B) total amounts in the two $N^+$ pillar layers 13 is equal to the (B—As) total amount in the $P^+$ pillar layer 14 with the difference of ±5% or less. The impurity amount can be controlled at the high precision by the simultaneous implantation of As and B ions into the trench side wall as described above.

Subsequently, after burying the insulator into the trench 22, the surface is flatted, for example, by CMP process or etching. In the first embodiment, the oxide film ($SiO_2$ film) is formed on the inner surface of the trench 22 by thermal oxidation, and further the $SiO_2$ film or the SiN film is formed by the chemical vapor deposition (CVD) process.

In this case, after an $Si_3N_4$ film or the $SiO_2$ film is formed on the inner wall of the trench 22, poly silicon may preferentially be deposited and buried in the trench. The poly silicon in the trench is not the current path, does not have to be completely buried, and can be buried at a high growth speed by growth from the opposite sides of the trench side surface.

Subsequently, the gate electrode 18 is formed on the channel region on the surface of the upper portion of the $P^+$ pillar layer 14 via the gate dielectric film 17, and the $N^+$ source region 16 is selectively formed on the surface of the $P^+$ pillar layer 14. Thereby, the DTMOS is obtained in which the $N^{++}$ Si substrate is the drain 10 and the $N^+$ pillar layer 13 is the current path between the $N^+$ source region 16 and the drain 10.

According to the NMOSFET having the structure shown in FIG. 7, similarly as the NMOSFET described with reference to FIG. 2, the power MOSFET which can satisfy both the reduction of the on-resistance and the enhancement of the breakdown voltage of the opposite direction between drain and source can be realized.

Furthermore, in the first embodiment, the planar pattern shape, and the like of the element isolation region and three-layered pillar are optimized, and the on-resistance property and breakdown voltage are improved.

Figure 8:
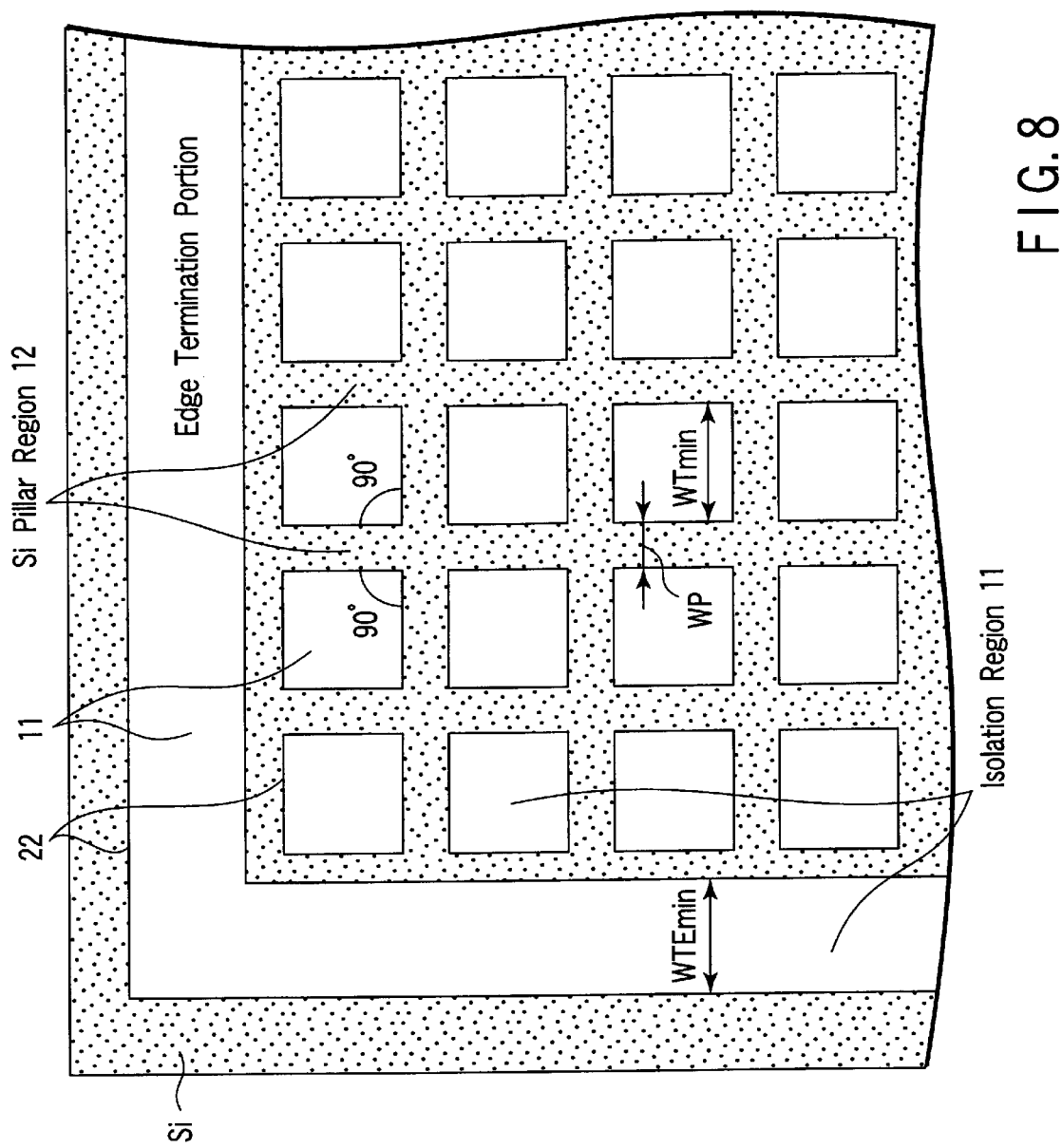
FIG. 8 is a plan view showing a part of the planar pattern of the DTMOS of FIG. 7.

FIG. 8 shows the planar pattern including the element isolation region 11, NPN pillar 12 and edge termination isolation region in FIG. 7.

The planar pattern of the element isolation region 11 is rectangular (e.g., square). The whole planar pattern of the NPN pillar (three-layered pillar) 12 sandwiched between the element isolation regions 11 is formed in a mesh form, and an intersecting portion of the mesh has a cross shape having an intersecting angle of 90°.

Since the NPN pillar 12 is entirely formed in the mesh form, a density of the NPN pillar 12 per unit area can be raised, and the on-resistance Ron can be reduced. Additionally, as compared with the DTMOS having the stripe pattern of FIG. 3, the density of the NPN pillar 12 is about double, and Ron decreases by 40% or more.

Here, a width WP of the NPN pillar 12 has been studied in order to secure the strength of the Si substrate in a cleaning process and insulator forming process after trench processing and to prevent the NPN pillar 12 from being partially broken. It is seen from a restriction of a manufacturing technique that with a depth DT of the trench for element isolation of about 50 µm or more, an upper limit of DT/WP is appropriately 60, and with DT of about 60 µm, WP is preferably set to 1 µm or more.

Moreover, as a result of trial manufacturing, it has been confirmed that steady manufacturing can be realized in WP of about 16 µm (the width of the N$^+$ pillar layer 13 is about 3 µm, and the width of the P$^+$ pillar layer 14 is about 10 µm), and DT/WP=3.75.

Therefore, an optimum range of DT/WP is 3.75≦DT/WP≦60. Thereby, WP is minimized in a range which can be permitted in view of a processing strength, the density of the NPN pillar 12 per unit area is maximized, and Ron can be minimized.

On the other hand, there is also an optimum range between the depth DT of the trench for element isolation and a minimum opening width (a minimum interval between the NPN pillars 12, that is, a minimum opening width of a mesh opening) WTmin. That is, the As and B ions are implanted into the wall surface of the trench for element isolation 22 formed vertically with respect to the surface of the Si substrate at a small incidence angle of 4° to 10° and the NPN pillar 12 is formed. In this case, when the ion implantation angle is less than 4°, an incidence angle of an ion beam is excessively small and some of incident particles are reflected by the Si surface. It has been seen that an ion implantation concentration cannot be obtained as scheduled. Therefore, WTmin/DT is tan4° or more. That is, an upper limit of DT/WTmin is 1/tan 4°, and DT/WTmin≦14.3 is appropriate.

Moreover, in order to reduce the trench region as much as possible and effectively use the substrate surface, WTmin is preferably as small as possible, and WTmin is determined by a trench processing technique. As a result of the trial manufacturing by Si etching by RIE using an inductively coupled plasma, it has been confirmed that stable manufacturing can be performed in DT of about 60 µm, WTmin of about 8 µm, and DT/WTmin=7.5, and in DT of about 55 µm, WTmin of about 10 µm, and DT/WTmin=5.5.

Therefore, an optimum range of DT/WTmin is 5.5≦DT/WTmin≦14.3. Thereby, WTmin can be minimized in a range in which no problem arises with respect to other properties, and the substrate surface can most effectively be used.

Figure 1:
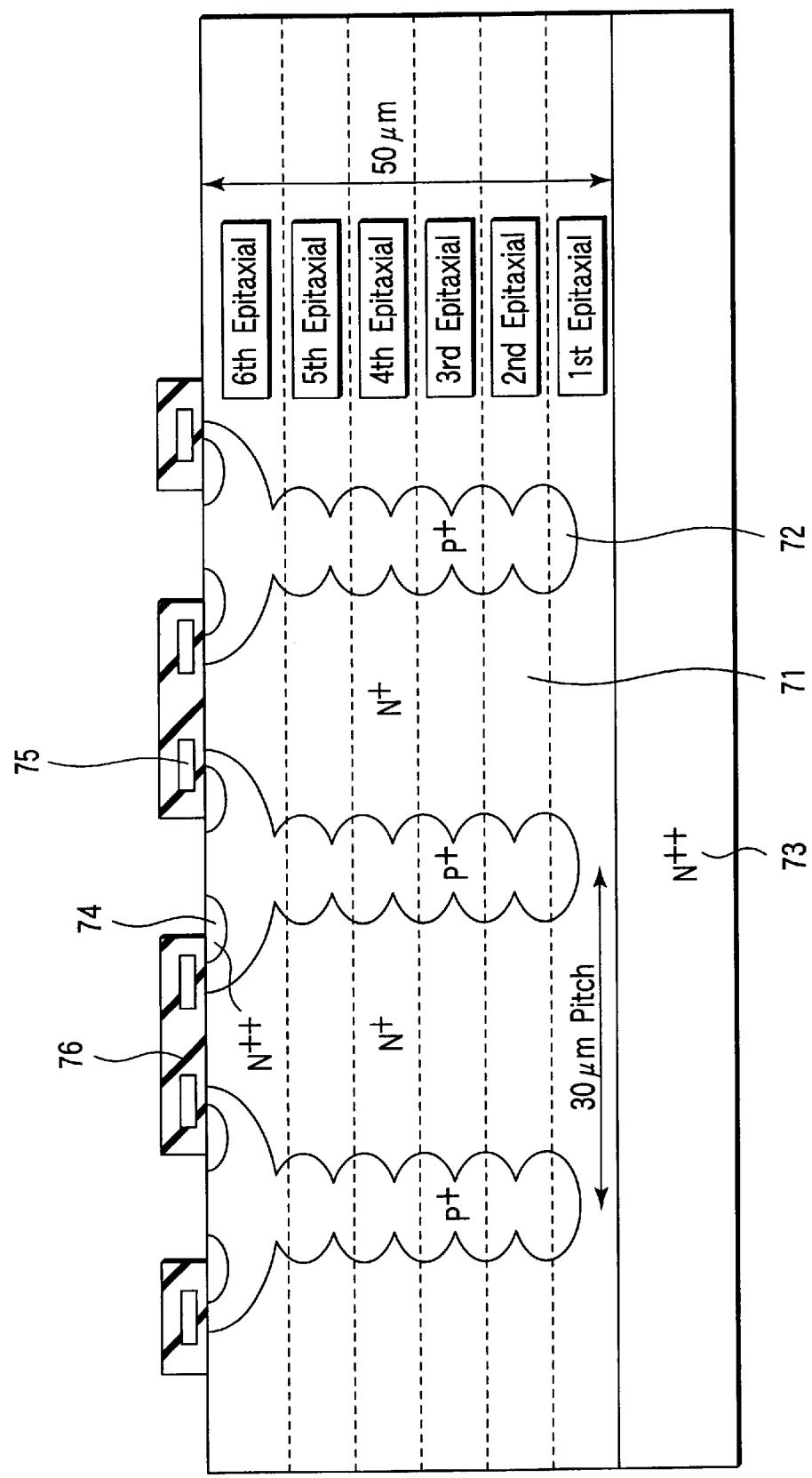
FIG. 1 is a sectional view showing a part of a power MOSFET having a conventional super junction structure.

When such relation is set, as compared with formation of the Si pillar at a pitch of about 30 µm in the stripe pattern in the MOSFET of the super junction structure shown in FIG. 1, the pillar area per unit area increases about twice, and Ron is reduced by about 40% or more in the DTMOS of 600V system.

On the other hand, the As and B ions are implanted also into the wall surface of the edge termination isolation region on an element forming region side of the edge termination trench similarly as the wall surface of the trench for element isolation, the NPN pillar 12 is formed on the element forming region side of the edge termination trench, and it is necessary to prevent the breakdown voltage from being lowered. In this case, in order to implant the As and B ions, a minimum opening width WTEmin of the edge termination trench needs to be equal to or more than the minimum opening width WTmin of the trench for element isolation (the minimum interval between the NPN pillars 12, that is, the minimum opening width of the mesh opening). Therefore, the opening width is set so as to satisfy WTEmin≧WTmin.

Additionally, in the first embodiment, the planar pattern of the NPN pillar 12 is formed in the mesh form, and the intersecting portion of the mesh has a cross shape with the intersecting angle of 90°. During the ion implantation of As and B for forming the NPN pillar 12, a wafer is rotated in order to enhance an in-plane uniformity (rotation ion implantation process). However, the ion implantation dosage per unit area is lowered in the cross shape intersecting portion of the trench wall surface as compared with other portions. As a result, there is a possibility that the breakdown voltage is lowered as compared with the DTMOS having the stripe pattern of FIG. 3.

In order to suppress the decrease of the breakdown voltage, the shape of the intersecting portion of the mesh is changed to a T shape in a second embodiment, and changed to a Y shape in a third embodiment. These embodiments will be described hereinafter.

<Second Embodiment>

Figure 9:
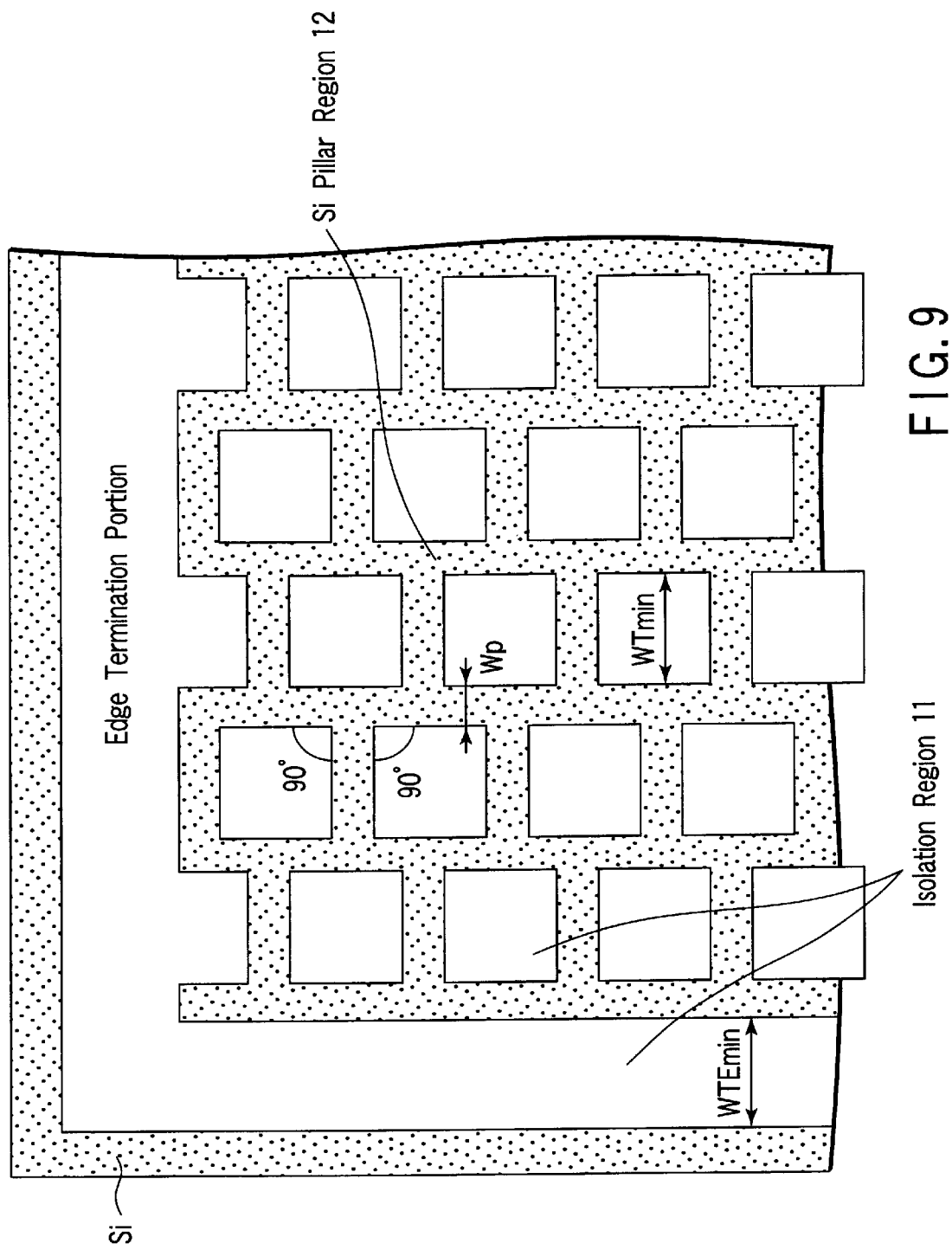
FIG. 9 is a plan view showing a planar pattern of a part of the element forming portion of the DTMOS having a T intersecting mesh pattern and a part of the chip termination portion according to a second embodiment of the present invention.

FIG. 9 shows the planar pattern of a part of the element forming portion of the chip of the DTMOS having a T intersecting mesh pattern according to the second embodiment.

For the DTMOS of the second embodiment, as compared with the DTMOS of the first embodiment described above with reference to FIGS. 7 and 8, the planar pattern of the NPN pillar 12 is different, but other respects are the same. Therefore, the same reference numerals as those of FIG. 8 are used.

That is, the planar pattern of the element isolation region 11 is rectangular, but the planar pattern of the NPN pillar 12 sandwiched between the element isolation regions 11 is entirely formed in the mesh form, and the intersecting portion of the mesh has a T shape having the intersecting angle of 90°.

According to the structure, the uniformity of the ion implantation dosage per unit area is enhanced in the T intersecting portion and other portions of the trench wall surface, and the breakdown voltage is enhanced by about 10 to 14% as compared with the DTMOS of the first embodiment.

<Third Embodiment>

Figure 10:
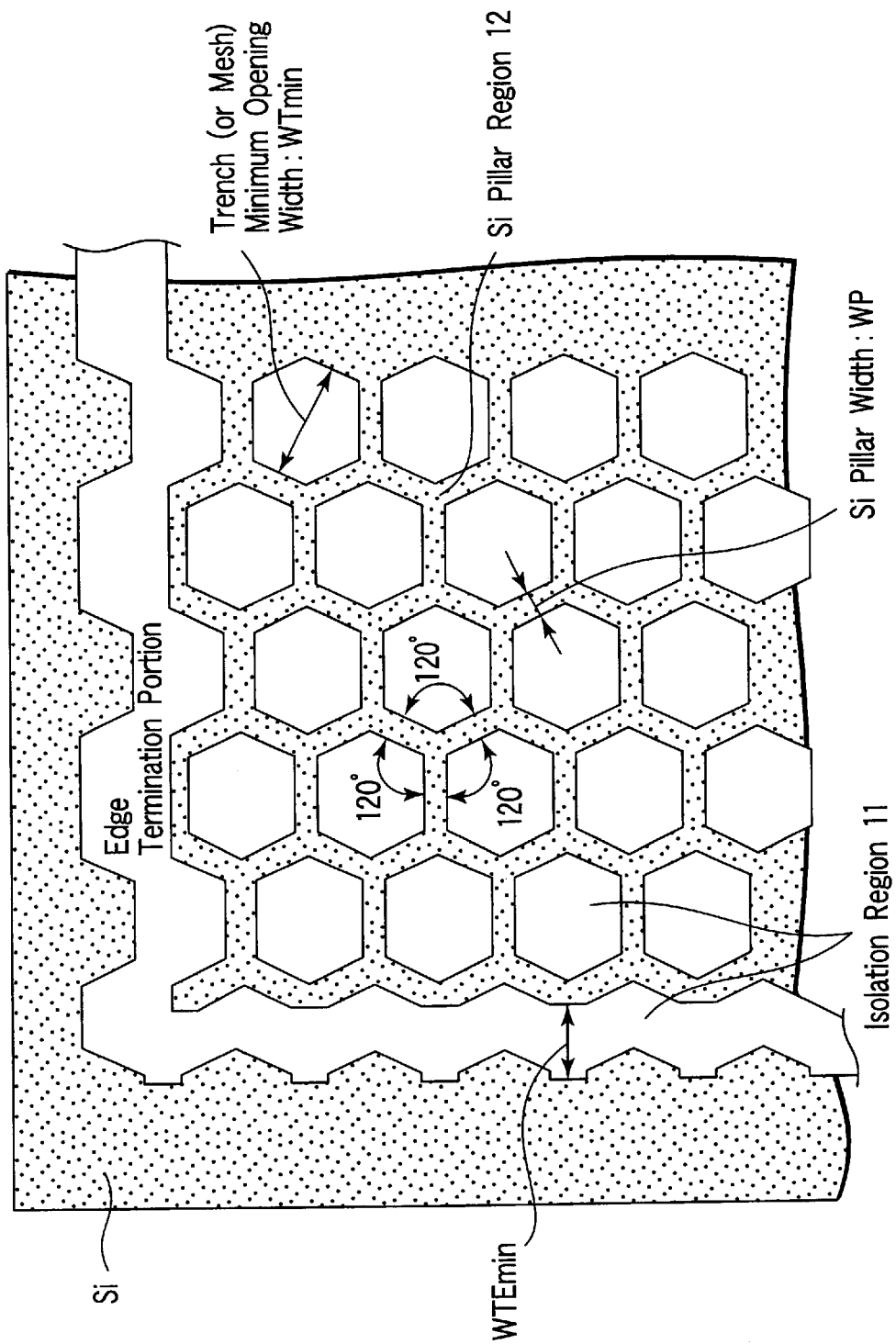
FIG. 10 is a plan view showing the planar pattern of a part of the element forming portion of the DTMOS having a Y intersecting mesh pattern and a part of the chip termination portion according to a third embodiment of the present invention.

FIG. 10 shows the planar pattern of a part of the element forming portion of the chip of the DTMOS having a Y intersecting mesh pattern according to the third embodiment.

For the DTMOS of the third embodiment, as compared with the DTMOS of the first embodiment described above with reference to FIGS. 7 and 8, the planar pattern of the NPN pillar 12 is different, but the other respects are the same. Therefore, the same reference numerals as those of FIG. 8 are used.

That is, the planar pattern of the element isolation region is hexagonal, the planar pattern of the NPN pillar 12 sandwiched between the element isolation regions 11 is entirely formed in the mesh form, and the intersecting portion of the mesh has a Y shape having the intersecting angle of 120°.

According to the structure, the uniformity of the ion implantation dosage per unit area is further enhanced in the Y intersecting portion of the trench wall surface and other portions. Moreover, the breakdown voltage is further enhanced, and the breakdown voltage equal to that of the DTMOS having the stripe pattern of FIG. 3 is obtained.

Additionally, the density of the NPN pillar 12 per unit area can further be raised, and Ron can further be reduced. Moreover, as compared with DTMOS having the stripe pattern in the proposed example described above with reference to FIG. 3, the Ron decreases by about 40% or more.

Figure 11:
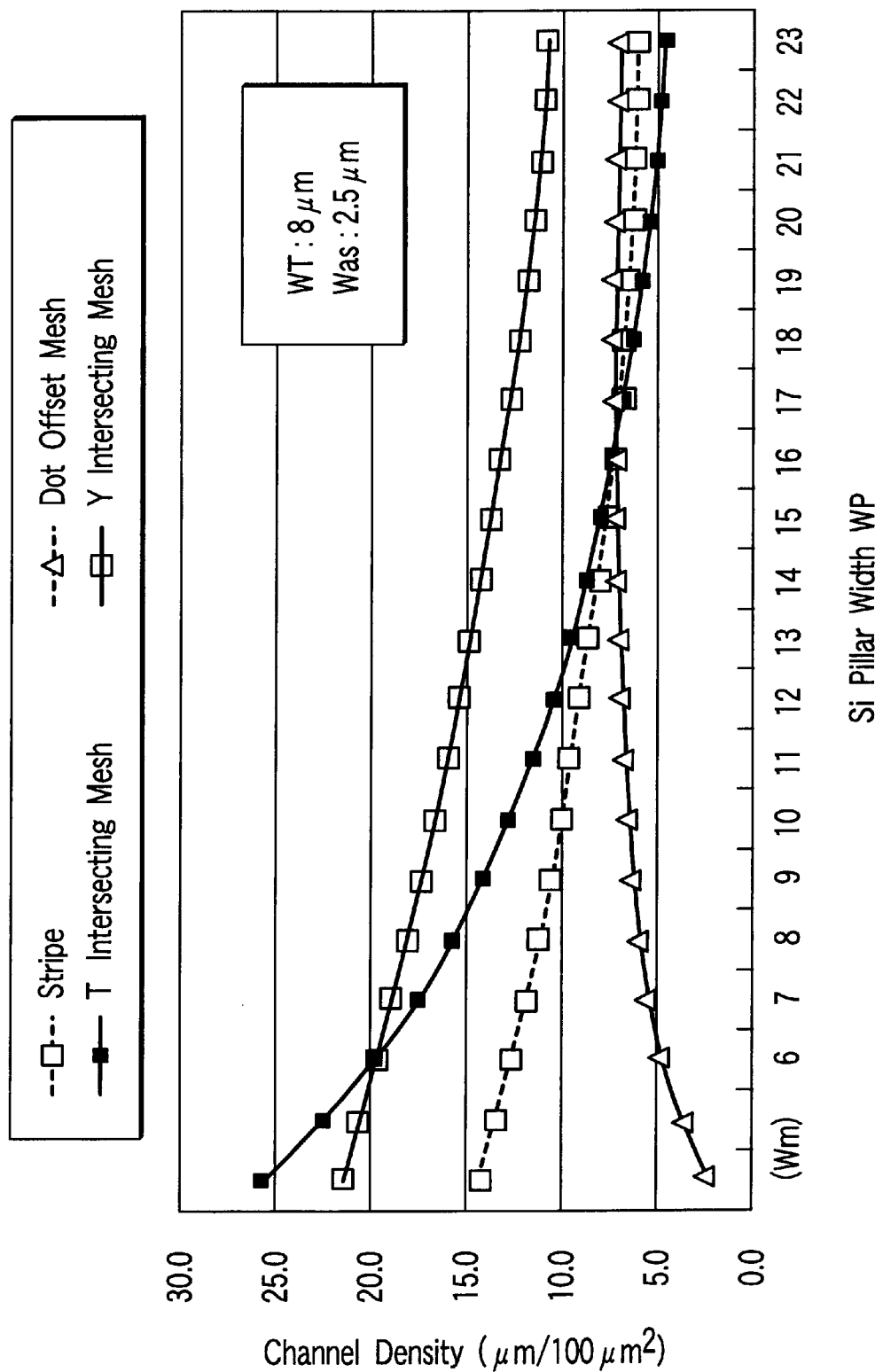
FIG. 11 is a characteristic diagram showing a relation between an Si pillar width and a channel density of the DTMOS according to the second and third embodiments.

FIG. 11 shows the channel densities of the DTMOS having the T intersecting mesh pattern of the second embodiment and DTMOS having the Y intersecting mesh pattern of the third embodiment in comparison with the DTMOS having the dot offset mesh pattern of FIG. 4.

Here, the channel density is shown in a case in which the width WP of the NPN pillar 12 is changed on the conditions such as an opening width of the trench for the element isolation region WT=8 $\mu$m, and width of the N$^+$ pillar layer 13 Was=2.5 $\mu$m.

As seen from FIG. 11, when WP is less than 6 $\mu$m, the channel density of the T intersecting mesh pattern is highest. When WP exceeds 6 $\mu$m, the channel density of the Y intersecting mesh pattern is highest, that is, the on-resistance (Ron) is lowered.

<Modification Examples of Respective Embodiments>

In the first to third embodiments, as shown in FIG. 5, the N$^{++}$ region 84a may be formed in the portion continued to the trench side wall portion in the surface of the N$^+$ pillar layer 13, so that the depletion layer is prevented from reaching the upper surface of the N$^+$ pillar layer 13 during applying of the voltage.

Moreover, for the element isolation region and edge termination region, as shown in FIG. 6, after formation of the dielectric film (e.g., $Si_3N_4$ or $SiO_2$) 85a on the trench inner wall, the insulator (poly silicon or $SiO_2$) 85b may be buried.

Additionally, in the above description, the N-type DTMOS has been described, but the present invention can similarly be applied to a P-type DTMOS. In this case, a first conductivity type is a p-type, a second conductivity type is an n-type, and the P$^+$ pillar layer in a PNP pillar layer constitutes the current path between the P$^+$ source region and the drain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
    a semiconductor substrate of a first conductivity type having a first main surface and a second main surface;
    a plurality of element isolation regions each formed to have a predetermined depth DT from said first main surface of said semiconductor substrate, and formed by filling a plurality of trenches with an insulator;
    a laterally three-layered pillar formed among said plurality of element isolation regions with a width WP and in a meshed planar shape, said three-layered pillar including a first pillar layer and a second pillar layer each being of said first conductivity type which contact two adjacent element isolation regions out of said plurality of element isolation regions over a depth direction, respectively, said three-layered pillar including a third pillar layer of a second conductivity type formed between said first pillar layer and said second pillar layer, and said three-layered pillar having a relation of $3.75 \leq DT/WP \leq 60$ between said width WP of said three-layered pillar and said depth DT of each of said plurality of element isolation regions;
    a base region of said second conductivity type formed on an upper surface of said third pillar layer of said second conductivity type;
    a source region of said first conductivity type selectively formed on an upper surface of said base region;
    a gate electrode formed on said base region between said source region and an upper surface of said first pillar layer or said second pillar layer in an insulating manner; and
    a drain layer of said first conductivity type formed on said second main surface of said semiconductor substrate, and contacting a lower surface of said three-layered pillar.

2. The semiconductor apparatus according to claim 1, wherein said three-layered pillar is formed by ion-implanting and subsequently thermally diffusing a first conductivity type impurity and a second conductivity type impurity into said semiconductor substrate from side walls of said plurality of trenches, so that said third pillar layer including said second conductivity type impurity is sandwiched between said first pillar layer and said second pillar layer including said first conductivity type impurity.

3. The semiconductor apparatus according to claim 2, wherein said semiconductor substrate is an N$^+$ type semiconductor substrate having an N$^-$ type epitaxial layer on an upper surface thereof, said first conductivity type impurity of said first pillar layer and said second pillar layer is arsenic, and said second conductivity type impurity of said third pillar layer is boron.

4. The semiconductor apparatus according to claim 1, wherein said plurality of element isolation regions include a portion in which a planar pattern of each of said plurality of element isolation regions is formed in a rectangular shape, and said plurality of element isolation regions in said portion are disposed in a matrix form, and
    an intersecting portion of a mesh of said meshed planar shape of said three-layered pillar has a cross shape having an intersecting angle of 90°.

5. The semiconductor apparatus according to claim 1, wherein said plurality of element isolation regions includes a portion in which a planar pattern of each of said plurality of element isolation regions is formed in a rectangular shape, and said plurality of element isolation regions are disposed at a predetermined pitch on a plurality of rows, such that said pitch of said plurality of rows is alternately offset for each row of said plurality of rows, and said three-layered pillar is formed in a mesh form in which planar patterns intersect one another in a T shape, and an intersecting portion of said T shape has an intersecting angle of 90°.

6. The semiconductor apparatus according to claim 1, wherein said plurality of element isolation regions includes a portion in which a planar pattern of each of said plurality of element isolation regions is formed in a hexagonal shape, and an intersecting portion of said meshed planar shape of said three-layered pillar has a Y shape having an intersecting angle of 120°.

7. The semiconductor apparatus according to claim 1, wherein said plurality of element isolation regions are formed by filling said plurality of trenches with poly silicon via an $SiO_2$ film or an $Si_3N_4$ film lining each inner wall of inner walls of said plurality of trenches.

8. A semiconductor apparatus comprising:

a semiconductor substrate of a first conductivity type having a first main surface and a second main surface;

a plurality of element isolation regions each formed to have a predetermined depth DT from said first main surface of said semiconductor substrate, and formed by filling a plurality of trenches with an insulator;

a laterally three-layered pillar formed among said plurality of element isolation regions with a width WP and in a meshed planar shape, so as to have a plurality of openings having a minimum opening width WTmin, said three-layered pillar including a first pillar layer and a second pillar layer each being of said first conductivity type which contact two adjacent element isolation regions out of said plurality of element isolation regions over a depth direction, respectively, said three-layered pillar including a third pillar layer of a second conductivity type formed between said first pillar layer and said second pillar layer, and said three-layered pillar having a relation of $5.5 \leq DT/WTmin \leq 14.3$ between said minimum opening width WTmin of said three-layered pillar and said depth DT of each element isolation region of said plurality of element isolation regions;

a base region of said second conductivity type formed on an upper surface of said third pillar layer of said second conductivity type;

a source region of said first conductivity type selectively formed on an upper surface of said base region;

a gate electrode formed on said base region between said source region and an upper surface of said first pillar layer or said second pillar layer in an insulating manner; and a drain layer of said first conductivity type formed on said second main surface of said semiconductor substrate, and contacting a lower surface of said three-layered pillar.

9. The semiconductor apparatus according to claim 8, wherein said width WP of said three-layered pillar and said depth DT of each element isolation region of said plurality of element isolation regions have a relation of $3.75 \leq DT/WP \leq 60$.

10. The semiconductor apparatus according to claim 8, wherein said three-layered pillar is formed by ion-implanting and subsequently thermally diffusing a first conductivity type impurity and a second conductivity type impurity into said semiconductor substrate from side walls of said plurality of trenches, such that said third pillar layer including said second conductivity type impurity is sandwiched between said first pillar layer and said second pillar layer including said first conductivity type impurity.

11. The semiconductor apparatus according to claim 10, wherein said semiconductor substrate is an $N^+$ type semiconductor substrate having an $N^-$ type epitaxial layer on an upper surface thereof, said first conductivity type impurity of said first pillar layer and said second pillar layer is arsenic, and said second conductivity type impurity of said third pillar layer is boron.

12. The semiconductor apparatus according to claim 8, wherein said plurality of element isolation regions include a portion in which a planar pattern of each of said plurality of element isolation regions is formed in a rectangular shape and said plurality of element isolation regions in said portion are disposed in a matrix form, and an intersecting portion of a mesh of said meshed planar shape of said three-layered pillar has a cross shape having an intersecting angle of 90°.

13. The semiconductor apparatus according to claim 8 wherein said plurality of element isolation regions includes a portion in which a planar pattern of each of said plurality of element isolation regions is formed in a rectangular shape, and said plurality of element isolation regions in said portion are disposed at a predetermined pitch on a plurality of rows, such that said pitch of said plurality of rows is alternately offset for each row of said plurality of rows, and said three-layered pillar is formed in a mesh form in which planar patterns intersect one another in a T shape, and an intersecting portion of said T shape has an intersecting angle of 90°.

14. The semiconductor apparatus according to claim 8, wherein said plurality of element isolation regions a portion in which a planar pattern of each of said plurality of element isolation regions is formed in a hexagonal shape, and an intersecting portion of said meshed planar shape of said three-layered pillar has a Y shape having an intersecting angle of 120°.

15. The semiconductor apparatus according to claim 8, wherein said plurality of element isolation regions are formed by filling said plurality of trenches with poly silicon via an $SiO_2$ film or an $Si_3N_4$ film lining each inner wall of inner walls of said plurality of trenches.

16. A semiconductor apparatus comprising:

a semiconductor substrate of a first conductivity type having a first main surface and a second main surface;

a plurality of element isolation regions each formed to have a predetermined depth DT from said first main surface of said semiconductor substrate, and formed by filling a plurality of trenches with an insulator;

a laterally three-layered pillar formed among said plurality of element isolation regions with a width WP and in a meshed planar shape so as to have a plurality of openings having a minimum opening width WTmin, said three-layered pillar including a first pillar layer and a second pillar layer each being of said first conductivity type which contact two adjacent element isolation regions out of said plurality of element isolation regions over a depth direction, respectively, and said three-layered pillar including a third pillar layer of a second conductivity type formed between said first pillar layer and said second pillar layer;

a base region of said second conductivity type formed on an upper surface of said third pillar layer of said second conductivity type;

a source region of said first conductivity type selectively formed on an upper surface of said base region;

a gate electrode formed on said base region between said source region and an upper surface of said first pillar layer or said second pillar layer in an insulating manner; and a drain layer of said first conductivity type formed on said second main surface of said semiconductor substrate, and contacting a lower surface of said three-layered pillar, wherein said plurality of element isolation regions include an edge termination isolation region surrounding a region with said three-layered pillar formed therein, and a relation with said minimum opening width WTmin of said three-layered pillar of said meshed planar shape satisfies WTEmin≧WTmin, wherein a minimum opening width of one of said plurality of trenches corresponding to said edge termination isolation region is WTEmin.

17. The semiconductor apparatus according to claim 16, wherein said opening width WTmin of said three-layered pillar and said depth DT of each element isolation region of said plurality of element isolation regions have a relation of 5.5≦DT/WTmin≦14.3.

18. The semiconductor apparatus according to claim 16, wherein said width WP of said three-layered pillar and said depth DT of each element isolation region of said plurality of element isolation regions have a relation of 3.75≦DT/WP≦60.

19. The semiconductor apparatus according to claim 16, wherein said three-layered pillar is formed by ion-implanting and subsequently thermally diffusing a first conductivity type impurity and a second conductivity type impurity into said semiconductor substrate from side walls of said plurality of trenches, so that said third pillar layer including said second conductivity type impurity is sandwiched between said first pillar layer and said second pillar layer formed by said first conductivity type impurity.

20. The semiconductor apparatus according to claim 19, wherein said semiconductor substrate is an $N^+$ type semiconductor substrate having an $N^-$ type epitaxial layer on an upper surface thereof, said first conductivity type impurity of said first pillar layer and said second pillar layer is arsenic, and said second conductivity type impurity of said third pillar layer is boron.

* * * * *